United States Patent
Fukumoto et al.

(10) Patent No.: US 7,742,024 B2
(45) Date of Patent: Jun. 22, 2010

(54) ELEMENT SUBSTRATE AND LIGHT EMITTING DEVICE

(75) Inventors: Ryota Fukumoto, Atsugi (JP); Aya Anzai, Kanagawa-ken (JP); Yu Yamazaki, Atsugi (JP); Mitsuaki Osame, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 804 days.

(21) Appl. No.: 11/549,946

(22) Filed: Oct. 16, 2006

(65) Prior Publication Data

US 2007/0241992 A1    Oct. 18, 2007

Related U.S. Application Data

(63) Continuation of application No. 10/866,081, filed on Jun. 14, 2004, now Pat. No. 7,122,969.

(30) Foreign Application Priority Data

Jun. 18, 2003    (JP)    ............................. 2003-174141

(51) Int. Cl.
*G09G 3/30*    (2006.01)
(52) U.S. Cl. ...................................... 345/76
(58) Field of Classification Search .................... 345/76
See application file for complete search history.

(56) References Cited

U.S. PATENT DOCUMENTS

| | | | |
|---|---|---|---|
| 5,517,207 A | 5/1996 | Kawada et al. | |
| 5,684,365 A | 11/1997 | Tang et al. | |
| 5,949,483 A * | 9/1999 | Fossum et al. | ............... 348/303 |
| 6,166,768 A * | 12/2000 | Fossum et al. | .............. 348/308 |
| 6,207,969 B1 | 3/2001 | Yamazaki | |
| 6,246,384 B1 | 6/2001 | Sano | |
| 6,542,222 B1 | 4/2003 | Tsuji et al. | |
| 6,661,180 B2 | 12/2003 | Koyama | |
| 6,714,178 B2 * | 3/2004 | Koyama et al. | ............... 345/76 |
| 6,730,966 B2 | 5/2004 | Koyama | |
| 6,753,654 B2 | 6/2004 | Koyama | |

(Continued)

FOREIGN PATENT DOCUMENTS

EP    0 717 446    6/1996

(Continued)

*Primary Examiner*—Richard Hjerpe
*Assistant Examiner*—Dorothy Webb
(74) *Attorney, Agent, or Firm*—Fish & Richardson P.C.

(57) ABSTRACT

No need of lowering off-current of a switching transistor, fewer luminance variations of a light emitting element between pixels due to characteristic variations of a driving transistor, and less risk of steps due to increase in the number of wirings. A video signal for light emission or non-emission of a pixel is input to a gate of a current controlling transistor operated in a linear region, which is connected in series with the driving transistor, through a switching transistor. Since a voltage Vds between a source and a drain of the current controlling transistor is small, small changes in a voltage Vgs between a gate and a source thereof do not affect a current flowing in a load. The current flowing in the light emitting element is determined by the driving transistor operated in a saturation region, and a fixed potential is input to the gate thereof during light emission.

18 Claims, 12 Drawing Sheets

U.S. PATENT DOCUMENTS

| | | |
|---|---|---|
| 6,972,743 B2 | 12/2005 | Kim et al. |
| 7,061,451 B2 | 6/2006 | Kimura |
| 7,141,934 B2 | 11/2006 | Osame et al. |
| 7,173,586 B2 | 2/2007 | Osame et al. |
| 7,187,350 B2 | 3/2007 | Yoshida |
| 7,358,942 B2 | 4/2008 | Yamazaki et al. |
| 2002/0005825 A1* | 1/2002 | Lee et al. ............... 345/76 |
| 2002/0101394 A1 | 8/2002 | Anzai |
| 2002/0196212 A1 | 12/2002 | Nishitoba et al. |
| 2003/0058687 A1 | 3/2003 | Kimura |
| 2003/0067424 A1 | 4/2003 | Akimoto et al. |
| 2003/0117352 A1 | 6/2003 | Kimura |
| 2003/0137503 A1* | 7/2003 | Kimura et al. ............... 345/212 |
| 2003/0222589 A1* | 12/2003 | Osame et al. ............ 315/169.1 |
| 2004/0041752 A1* | 3/2004 | Kimura ....................... 345/76 |
| 2004/0189214 A1 | 9/2004 | Osame et al. |
| 2004/0207615 A1 | 10/2004 | Yumoto |
| 2004/0252565 A1 | 12/2004 | Yamazaki et al. |
| 2004/0263506 A1* | 12/2004 | Koyama et al. ............. 345/204 |
| 2005/0162354 A1* | 7/2005 | Osame et al. ................. 345/76 |

FOREIGN PATENT DOCUMENTS

| | | |
|---|---|---|
| JP | 08-234683 | 9/1996 |
| WO | WO 2004021326 A1 * | 3/2004 |

\* cited by examiner

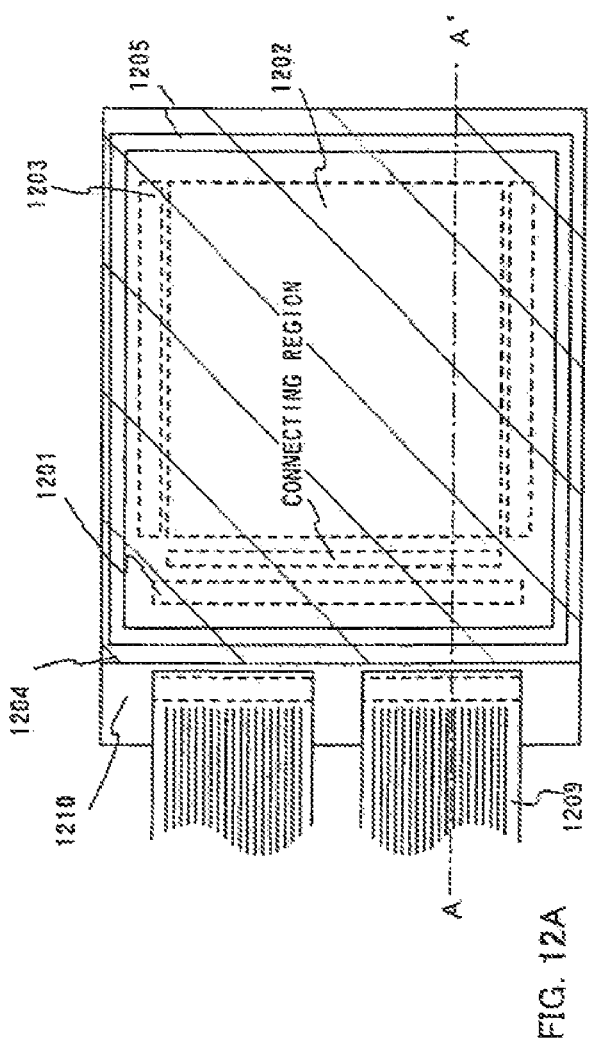
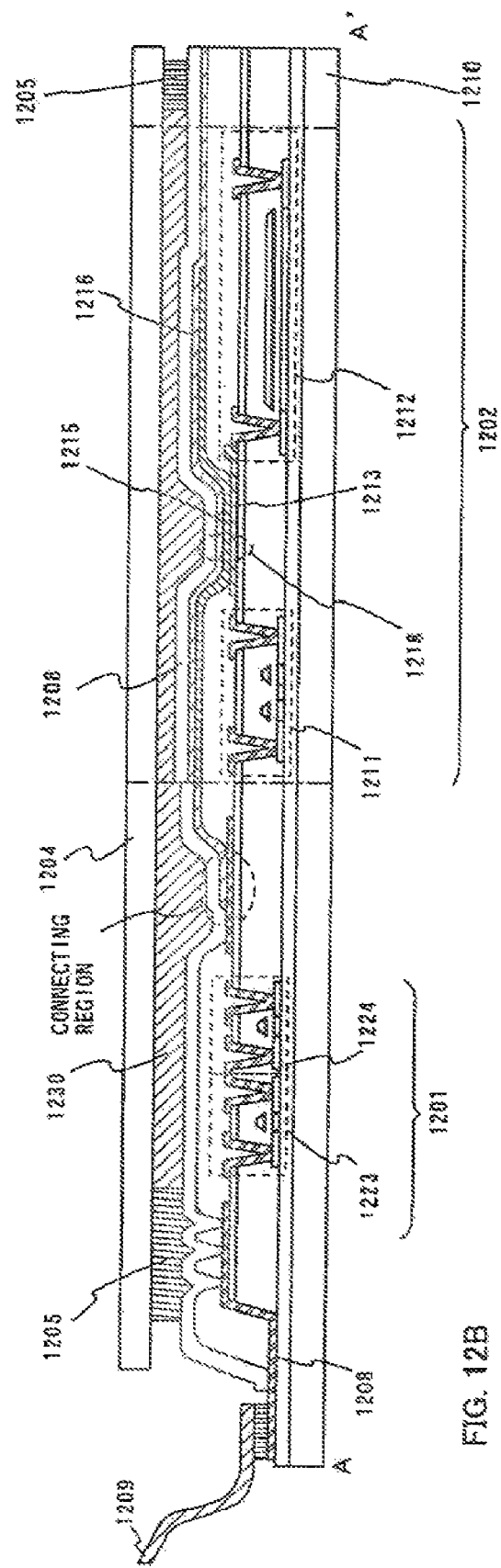
FIG. 12A
FIG. 12B

ELEMENT SUBSTRATE AND LIGHT EMITTING DEVICE

BACKGROUND OF THE INVENTION

1. Field of the Invention

The present invention relates to a light emitting device with a control system for light emission of a light emitting element and to an element substrate including the control system.

2. Description of the Related Art

In display panels using an organic electroluminescence medium, a flat panel formed of pixels using thin film transistors has been disclosed (e.g. Patent Document 1). A configuration and an operation of a pixel included in such a conventionally well known flat panel are described in brief hereinafter with reference to drawings.

A pixel shown in FIG. 7 comprises a switching transistor 700 whose gate is connected to a scan line 705, either a source or a drain of which is connected to a signal line 704 and the other is connected to a gate of a driving transistor 701. A source of the driving transistor 701 is connected to a power supply line 706 and a drain thereof is connected to an anode of a light emitting element 703. The other terminal of the light emitting element 703 is connected to a counter electrode 707. A capacitor 702 is disposed so as to hold a potential difference between the gate and the source of the driving transistor 701. A predetermined voltage is applied from a power supply to the power supply line 706 and the counter electrode 707 so as to have a potential difference therebetween.

When the switching transistor 700 is turned ON by a signal of the scan line 705, a video signal of the signal line 704 is input to the gate of the driving transistor 701. A potential difference between the input video signal and the power supply line 706 is a voltage Vgs between the gate and the source of the driving transistor 701. Then, a current is supplied to the light emitting element 703 and thereby the light emitting element 703 emits light.

Patent Document 1:
Japanese Patent Application Laid-Open No. Hei 8-234683, pp. 5, FIG. 1

SUMMARY OF THE INVENTION

A transistor using a polycrystalline silicon film formed on a glass substrate by laser anneal and the like exhibits high field effect mobility and large amount of on-current can be realized. Therefore, a transistor using a polycrystalline silicon film is generally considered to be useful for the pixel shown in FIG. 7.

However, characteristics of a transistor using a polycrystalline silicon vary easily due to a defect in a grain boundary.

In the pixel shown in FIG. 7, when a drain current of the driving transistor 701 differs in each pixel, variations in luminance of the light emitting element 703 are realized in each pixel even when a video signal with the same potential is input.

Off-current of the switching transistor 700 needs to be lowered whereas on-current thereof needs to be increased for charging the capacitor 702. However, it is difficult to realize both at the same time in transistor manufacturing steps. Also, the Vgs of the driving transistor 701 varies due to switching of the switching transistor 700, potential changes of the signal line 704 and the scan line 705, and the like. This is caused by a parasitic capacitance on the gate of the driving transistor 701.

In addition, as the resolution is increased and the pixel pitch is narrowed, a space between wirings needs to be narrowed. However, pattern defects such as a short circuit between wirings are caused by dust and the like in panel manufacturing steps and linear defects are increased.

The invention provides a light emitting device and an element substrate, in which off-current of the switching transistor needs not to be lowered, the capacitance of a capacitor need not to be increased, less effect of a parasitic capacitance is received, variations in luminance of a light emitting element between pixels due to variations in characteristics of a driving transistor can be suppressed, reduction in the aperture ratio is suppressed as much as possible, and the risk of the step due to increase in the number of wirings is minimized.

The invention provides a light emitting device and an element substrate, in which a gate potential of a driving transistor is fixed and the driving transistor is operated a saturation region so as to supply a current at all times, and has the following features.

A current controlling transistor operated in a linear region is connected in series with a driving transistor, and a video signal for transmitting light emission or non-emission of a pixel is input to a gate of the current controlling transistor through a switching transistor. Since the current controlling transistor is operated in a linear region, a voltage Vds between a source and a drain thereof is small, and small changes in a voltage Vgs between a gate and a source of the current controlling transistor do not affect a current flowing in a load (e.g., light emitting element). The current flowing in the light emitting element is determined by the driving transistor operated in a saturation region. A fixed potential is input to a gate of the driving transistor at least while the light emitting element emits light, and this is referred to as a gate potential fixing method during light emission in this specification.

Thus, a current flowing in a load (e.g., light emitting element) can be prevented from being varied without increasing the capacitance of a capacitor provided between the gate and the source of the current controlling transistor or without lowering off-current of the switching transistor. Furthermore, a parasitic capacitance on the gate of the current controlling transistor does not influence the current flowing in the load. Consequently, causes of variations are decreased, and image quality is thus enhanced significantly. As there is no need to lower off-current of the switching transistor, transistor manufacturing steps can be simplified, leading to cost reduction and improvement in yield.

However, a power supply line for inputting a fixed potential to the gate of the driving transistor is additionally provided, accompanying the increase of a risk of a short circuit between adjacent wirings or a short circuit due to a dust caused by the step. The following configuration is thus applied in the invention and transistors are connected in a new arrangement in order to reduce the number of wirings.

The invention provides a light emitting device having a plurality of pixel each of which comprises a first transistor for controlling an amount of current flowing in a light emitting element and a second transistor for controlling ON/OFF of a current flowing in the light emitting element by a video signal. In the pixel, a first power supply for supplying a current to the light emitting element, the first transistor, the second transistor, and the light emitting element are connected in series. Between adjacent two pixels, each gate electrode of the first transistors is connected to each other with a wiring and the gate electrodes are connected to a second power supply. That is, the gate electrodes of the first transistors in adjacent pixels are connected to each other with a wiring and the gate electrode is connected to the second power supply, therefore at least adjacent two pixels have the same gate potential. In short, the gate electrode is used as a wiring. A wiring for connecting each gate electrode of the first transistors is provided inside a pixel portion.

The invention provides a light emitting device having a pixel portion comprising a plurality of pixels, each of which comprises a first transistor, a second transistor, and a light emitting element which are connected in series with each other. The pixel portion comprises a scan line extending in one direction, a signal line extending in a direction which intersects with the scan line, and a power supply line. Between adjacent pixels, each gate electrode of the first transistor is connected to each other with a wiring inside the pixel portion. That is, the wiring serves as a connector between gate electrodes of adjacent first transistors.

According to the light emitting device of the invention, the first transistor and the second transistor preferably have the same conductivity. It is preferable that a channel length of the first transistor is longer than a channel width thereof, and a channel length of the second transistor is equal to or shorter than a channel width thereof. In addition, a ratio of the channel length to the channel width of the first transistor is preferably five or more.

The invention provides an element substrate having a plurality of pixels each of which comprises a first transistor for controlling an amount of current flowing in a pixel electrode and a second transistor for controlling ON/OFF of a current flowing in the pixel electrode by a video signal. In the pixel electrode, a first power supply for supplying a current, the first transistor, the second transistor, and the pixel electrode are connected in series. Between adjacent two pixels, each gate electrode of the first transistors is connected to each other with a wiring and the gate electrodes are connected to a second power supply. That is, the gate electrodes of the first transistors in adjacent pixels are connected to each other with a wiring and the gate electrodes are connected to the second power supply, therefore at least adjacent two pixels have the same gate potential. A wiring for connecting each gate electrode of the first transistors is provided inside a pixel portion.

The invention provides an element substrate having a pixel portion comprising a plurality of pixel electrodes, each of which comprises a first transistor and a second transistor which are connected in series with each other. The pixel portion comprises a first wiring extending in one direction, a second wiring extending in a direction which intersects with the first wiring, and a third wiring. Between adjacent pixel electrodes, each gate electrode of the first transistors is connected to each other with a fourth wiring inside the pixel portion.

According to the element substrate of the invention, the first transistor and the second transistor preferably have the same conductivity. It is preferable that a channel length of the first transistor is longer than a channel width thereof, and a channel length of the second transistor is equal to or shorter than a channel width thereof. In addition, a ratio of the channel length to the channel width of the first transistor is preferably five or more.

A light emitting device in the invention is a device of displaying data by using a light emitting element of which light emission controllable by current or voltage, and more preferably, a device configured by combining an active element such as a transistor and the light emitting element. Also, the light emitting device of the invention includes a panel and a module in which an IC or the like including a controller is mounted on the panel. In addition, the invention relates to an element substrate which is one mode before the completion of a panel in manufacturing steps of the light emitting device, and the element substrate comprises a plurality of pixels each having a supply system for supplying current to a light emitting element.

A light emitting element in the invention is typically an element made of an organic material or an inorganic material that generates electroluminescence, or an element that generates fluorescence of phosphorescence. The light emitting element also includes an element that generates cold light and may include a light emitting diode or a light emitting element made of a material that generates electrochromic. The light emitting element also includes an electron source element used in an FED (Field Emission Display).

An OLED (Organic Light Emitting Diode) is a kind of light emitting element and includes an anode, a cathode, and a layer (referred to as an electroluminescent layer hereinafter) containing an electroluminescent material which generates electroluminescence when an electric field is applied. The electroluminescent layer is interposed between the anode and the cathode and formed of single or multiple layer, which may contain an inorganic compound. The luminescence in the electroluminescent layer includes luminescence (fluorescence) that is generated when an excited singlet state returns to a ground state and luminescence (phosphorescence) that is generated when an excited triplet state returns to a ground state.

BRIEF DESCRIPTION OF THE DRAWINGS

FIGS. 12A and 12B are views showing one mode of a module of the invention.

DETAILED DESCRIPTION OF THE INVENTION

Embodiment Mode 1

Figure 1:
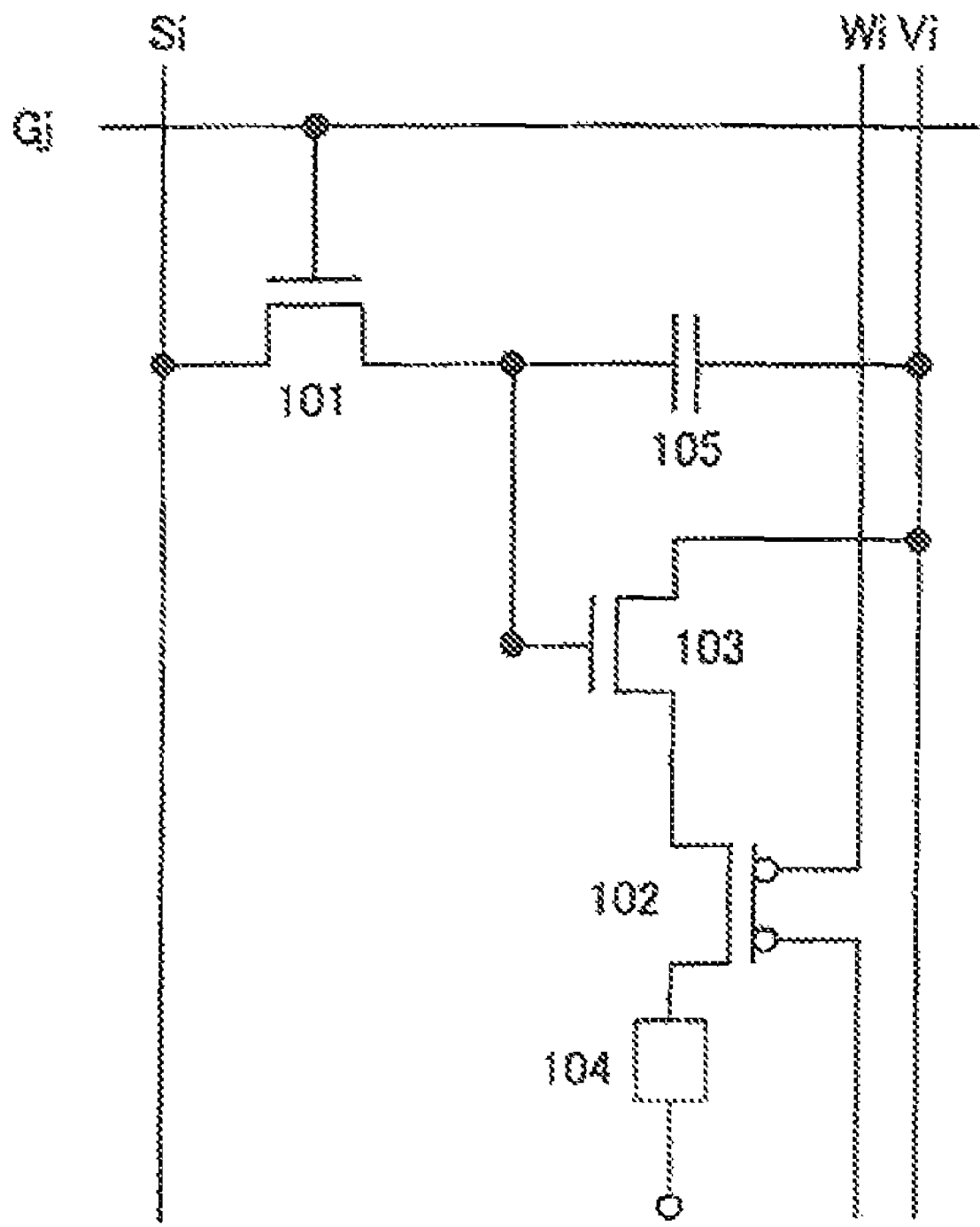
FIG. 1 is a circuit diagram showing a pixel configuration which is an embodiment mode of the invention.

FIG. 1 shows an embodiment mode of a pixel of a light emitting device of the invention. The pixel shown in FIG. 1 comprises a light emitting element 104, a transistor (switching transistor) 101 used as a switching element for controlling an input of a video signal to the pixel, a driving transistor 10 for controlling an amount of current flowing in the light emitting element 104, and a current controlling transistor 103 for controlling a current supply to the light emitting element 104. In addition, a capacitor 105 for storing a video signal potential may be provided in the pixel.

Symbol for the driving transistor 102 in FIG. 1 is explained here. This symbol represent a transistor that two contact points are formed at the gate electrode, which is different from a typical connection. Therefore, the driving transistor 102 is specially represented by this symbol. That is, one end of the gate electrode and the other end thereof are connected to a wiring. In this configuration, the gate electrode serves as a part of the wire.

The driving transistor 102 and the current controlling transistor 103 have the same conductivity. In this embodiment mode, the driving transistor 102 is operated in a saturation region and the current controlling transistor 103 is operated in a linear region.

A channel length L of the driving transistor 102 may be longer than its channel width W, and a channel length L of the current controlling transistor 103 may be equal to or shorter than its channel width W. More desirably, the ratio of L to W of the driving transistor 102 is five or more.

It is to be noted that, either an enhancement mode transistor or a depletion mode transistor may be employed as the driving transistor 102.

In addition, either an N-type transistor or a P-type transistor may be employed as the switching transistor 101.

A gate of the switching transistor 101 is connected to a scan line Gj (j=1 to y). Either a source or a drain of the switching transistor 101 is connected to a signal line Si (i=1 to x), and the other is connected to a gate of the current controlling transistor 103. A gate of the driving transistor 102 is connected to a second power supply line Wi (i=1 to x), and the other is connected to a gate of the current controlling transistor 103. A gate of the driving transistor 102 is connected to a second power supply line Wi (i=1 to x).

According to this embodiment mode, the driving transistor is connected so as to have two contact points between the gate electrode and the wiring and use the gate electrode as a part of the wiring. Accordingly, the area where the second power supply line Wi (i=1 to x) is disposed in parallel with the signal line Si (i=1 to x) or a first power supply line on the same layer is reduced. The transistor with the above-mentioned connection brings the decrease in occurrence of a short circuit between wiring due to dust and the like in manufacturing steps.

The driving transistor 102 and the current controlling transistor 103 are each connected to the first power supply line Vj (i=1 to x) and the light emitting element 104 so that a current supplied from the first power supply line Vi (i=1 to x) is supplied to the light emitting element 104 as a drain current of the driving transistor 102 and of the current controlling transistor 103. In this embodiment mode, a source of the current controlling transistor 103 is connected to the first power supply line Vi (i=1 to x) and the drain of the driving transistor 102 is connected to a pixel electrode of the light emitting element 104.

It is to be noted that, a source of the driving transistor 102 may be connected to the first power supply line Vi (i=1 to x) and the drain of the current controlling transistor 103 may be connected to the pixel electrode of the light emitting element 104.

The light emitting element 104 comprises and anode, a cathode, and an electroluminescent layer interposed between the anode and the cathode. As shown in FIG. 1, when the anode of the light emitting element 104 is connected to the driving transistor 102, the anode is a pixel electrode and the cathode is a counter electrode. The counter electrode of the light emitting element 104 and the first power supply line Vi (i=1 to x) have a potential difference so that a forward bias current is supplied to the light emitting element 104.

One of two electrodes of the capacitor 105 is connected to the first power supply line Vi (i=1 to x), and the other is connected to the gate of the current controlling transistor 103. The capacitor 105 is provided so as to store a potential difference between the two electrodes of the capacitor 105 when the switching transistor 101 is not selected (off state).

It is to be noted that although FIG. 1 shows a configuration in which the capacitor 105 is provided between the first power supply line Vi (i=1 to x) and the gate of the current controlling transistor 103, the invention is not limited to this. The capacitor 105 may be provided between the second power supply line Wi (i=1 to x) and the gate of the current controlling transistor 103, or the capacitor 105 may be omitted.

In FIG. 1, each of the driving transistor 102 and the current controlling transistor 103 is a P-type transistor, and the drain of the driving transistor 102 is connected to the anode of the light emitting element 104. Meanwhile, in the case where each of the driving transistor 102 and the current controlling transistor 103 is an N-type transistor, the source of the driving transistor 102 is connected to the cathode of the light emitting element 104. In this case, the cathode of the light emitting element 104 is a pixel electrode and the anode thereof is a counter electrode.

Next, a driving method of the pixel shown in FIG. 1 is described. The operation of the pixel shown in FIG. 1 can be divided into a writing period and a data retention period. First, when a scan line Gj (j=1 to y) is selected in a writing period, the switching transistor 101 whose gate is connected to the first scan line Gj (j=1 to y) is turned ON. Then, a video signal which is input to a signal line Si (i=1 to x) is input to the gate of the current controlling transistor 103 through the switching transistor 101. Note that the driving transistor 102 is in ON-state all the time since the gate of the driving transistor 102 is connected to the second power supply line Wi (i=1 to x).

When the current controlling transistor 103 is turned ON by the video signal, a current is supplied to the light emitting element 104 through the first power supply line Vi (i=1 to x). The current controlling transistor 103 is operated in a linear region at this time, thereof, a current flowing in the light emitting element 104 is determine by V–1 characteristics of the driving transistor 102 operated in a saturation region and the light emitting element 104. The light emitting element 104 emits light at luminance corresponding to the amount of supplied current.

When the current controlling transistor 103 is turned OFF by the video signal, no current is supplied to the light emitting element 104, thus the light emitting element 104 does not emit light.

In a data retention period, the switching transistor 101 is turned OFF by controlling a potential of the scan line Gj (j=1 to y), thereby a potential of the video signal that has been written in the writing period is stored. In the writing period, when the current controlling transistor 103 is turned ON, a potential of a video signal is stored in the capacitor 105, therefore, a current is supplied to the light emitting element 104 continuously. Meanwhile, when the current controlling transistor 103 is turned OFF in the writing period, a potential of a video signal is stored in the capacitor 105, therefore, no current is supplied to the light emitting element 104.

An element substrate of the invention corresponds to one mode before the completion of a light emitting element in manufacturing steps of the light emitting device of the invention.

A transistor used in the light emitting device of the invention may be a transistor using single crystalline silicon or an SOI substrate, a thin film transistor using polycrystalline silicon or amorphous silicon, or a transistor using organic semiconductor or carbon nanotube. In addition, a transistor provided in a pixel of the light emitting device of the invention may be a single gate transistor, a double gate transistor, or a multi-gate transistor having more than two gate electrodes.

According to the above-mentioned configuration, since the current controlling transistor 103 is operated in a linear region, a voltage Vds between the source and the drain thereof is small, and small changes in a voltage Vgs between the gate and the drain of the current controlling transistor 103 does not influence a current flowing in the light emitting element 104. The current flowing in the light emitting element 104 is determined by the driving transistor 102 operated in a saturation region. Therefore, a current flowing in the light emitting element 104 can be prevented from being varied without increasing the capacitance of the capacitor 105 provided between the gate and the source of the current controlling transistor 103 or without lowering off-current of the switching transistor 101. Furthermore, a parasitic capacitance on the gate of the current controlling transistor 103 does not influence the current flowing in the light emitting element 104. Consequently, causes of variations are decreased, and image quality can be enhanced.

Embodiment Mode 2

Described in this embodiment mode is a configuration of a pixel of the light emitting device of the invention, which is different from that shown in FIG. 1.

Figure 2:
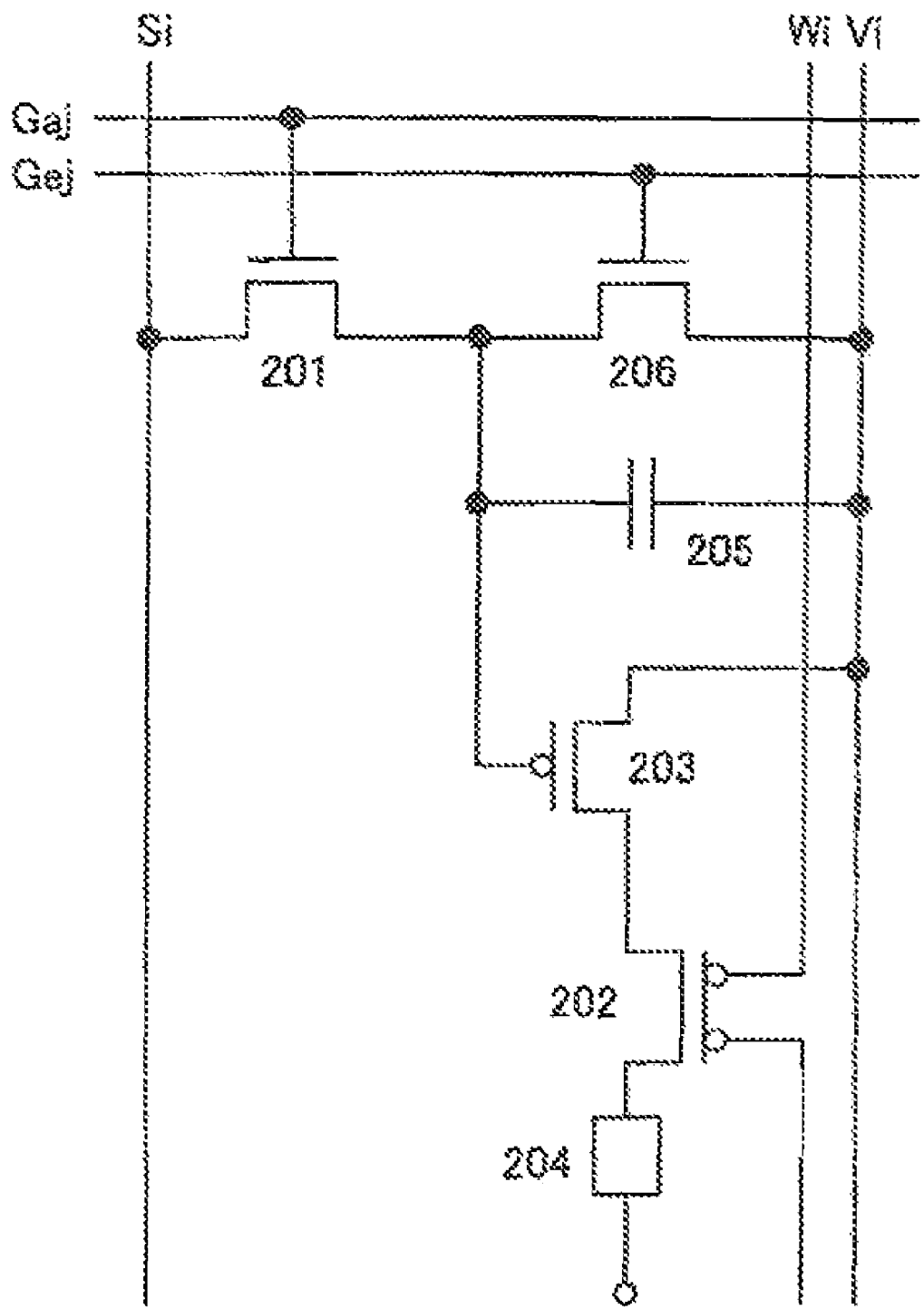
FIG. 2 is a circuit diagram showing a pixel configuration which is an embodiment mode of the invention.

The pixel shown in FIG. 2 comprises a light emitting element 204, a switching transistor 201, a driving transistor 202, a current controlling transistor 203, and a transistor (erasing transistor) 206 for forcibly turning OFF the current controlling transistor 203. In addition, a capacitor 205 may be provided in the pixel.

The driving transistor 202 and the current controlling transistor 203 have the same conductivity. In the invention, the driving transistor 202 is operated in a saturation region and the current controlling transistor 203 is operated in a linear region.

A channel length L of the driving transistor 202 may be longer than its channel width W, and a channel length L of the current controlling transistor 203 may be equal to or shorter than its channel width W. Desirably, the ratio of L to W of the driving transistor 202 is five or more.

It is to be noted that, either an enhancement mode transistor or a depletion mode transistor may be employed as the driving transistor 202. In addition, either an N-type transistor or a P-type transistor may be employed as the switching transistor 201 and the erasing transistor 206.

A gate of the switching transistor 201 is connected to a first scan line Gaj (j=1 to y). Either a source or a drain of the switching transistor 201 is connected to a signal line Si (i=1 to x), and the other is connected to a gate of the current controlling transistor 203. A gate of the erasing transistor 206 is connected to a second scan line Gej (j=1 to y). Either a source or a drain of the erasing transistor 206 is connected to a first power supply line Vi (i=1 to x), and the other is connected to the gate of the current controlling transistor 203. A gate of the driving transistor 202 is connected to a second power supply line Wi (i=1 to x).

According to this embodiment mode, the driving transistor 202 is connected so as to have two contact points between a gate electrode and a wiring and use the gate electrode as a part of the wiring. Accordingly, the area where the second power supply line Wi (i=1 to x) is disposed in parallel with the signal line Si (i=1 to x) or the first power supply line on the same layer is reduced. The transistor with the above-mentioned connection brings the decrease in a risk of a short circuit between wirings due to dust and the like in steps.

The driving transistor 202 and the current controlling transistor 203 are each connected to the first power supply line Vi (i=1 to x) and the light emitting element 204 so that a current from the first power supply line Vi (i=1 to x) is supplied to the light emitting element 204 as a drain current of the driving transistor 202 and of the current controlling transistor 203. In this embodiment mode, a source of the current controlling transistor 203 is connected to the first power supply line Vi (i=1 to x) and the drain of the driving transistor 202 is connected to a pixel electrode of the light emitting element 204.

It is to be noted that, a source of the driving transistor 202 may be connected to the first power supply line Vi (i=1 to x) and the drain of the current controlling transistor 203 may be connected to the pixel electrode of the light emitting element 204.

The light emitting element 204 comprises an anode, a cathode, and an electroluminescent layer interposed between the anode and the cathode. As shown in FIG. 2, when the anode of the light emitting element 204 is connected to the driving transistor 202, the anode is a pixel electrode and the cathode is a counter electrode. The counter electrode of the light emitting element 204 and the first power supply line Vi (i=1 to x) have a potential difference so that a forward bias current is supplied to the light emitting element 204.

One of two electrodes of the capacitor 205 is connected to the first power supply line Vi (i=1 to x), and the other is connected to the gate of the current controlling transistor 203.

The capacitor 205 is provided so as to store a potential difference between the two electrodes of the capacitor 205 when the switching transistor 201 is not selected (off state). It is to be noted that although FIG. 2 shows a configuration in which the capacitor 205 is provided between the first power supply line Vi (i=1 to x) and the gate of the current controlling transistor 203, the invention is not limited to this. The capacitor 205 may be provided between the second power supply line Wi (i=1 to x) and the gate of the current controlling transistor 203, or the capacitor 205 may be omitted.

In FIG. 2, each of the driving transistor 202 and the current controlling transistor 203 is a P-type transistor, and the drain of the driving transistor 202 is connected to the anode of the light emitting element 204. Meanwhile, in the case where each of the driving transistor 202 and the current controlling transistor 203 is an N-type transistor, the source of the driving transistor 202 is connected to the cathode of the light emitting element 204. In this case, the cathode of the light emitting element 204 is a pixel electrode and the anode thereof is a counter electrode.

An operation of the pixel shown in FIG. 2 can be divided into a writing period, a data retention period, and an erasing period. The operations of the witching transistor 201, the driving transistor 202, and the current controlling transistor 203 in the writing period and the data retention period are the same as those in FIG. 1.

In an erasing period, the second scan line Gej (j=1 to y) is selected to turn ON the erasing transistor 206, thus a potential of the first power supply line Vi (i=1 to x) is supplied to the gate of the current controlling transistor 203 through the erasing transistor 206. Therefore, the current controlling transistor 203 is turned OFF, and the light emitting element 204 can be forcibly brought into the state where no current is supplied.

Embodiment Mode 3

Described in this embodiment mode are a construction and the driving of a light emitting device having active matrix pixels driven by thin film transistors (TFTs).

Figure 3:
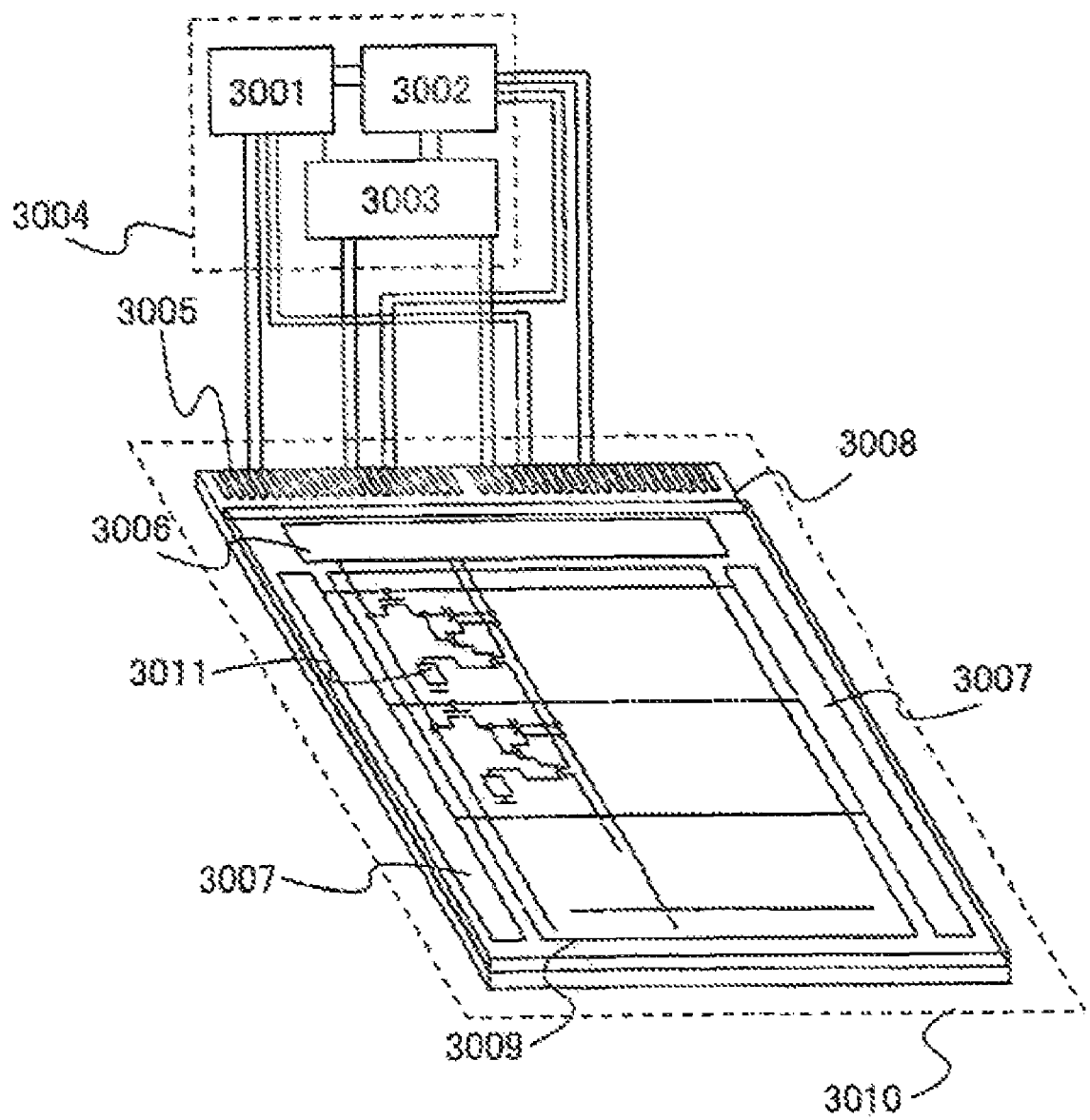
FIG. 3 is a schematic diagram of an external circuit and a panel, which are an embodiment mode of the invention.

FIG. 3 is a block diagram of an external circuit and a schematic diagram of a panel. An active matrix display device shown in FIG. 3 comprises an external circuit 3004 and a panel 3010. The external circuit 3004 comprises an A/D converter unit 3001, a power supply unit 3002, and a signal generator unit 3003. The A/D converter unit 3001 converts an image data signal which is input as an analog signal into a digital signal (video signal), and supplies it to a signal line driver circuit 3006. The power supply unit 3002 generates power having a predetermined voltage from power supplied by a battery or an outlet, and supplies the generated power to the signal line driver circuit 3006, scan line driver circuits 3007, a light emitting element 3011, the signal generator unit 3003, and the like. Power, an image signal, a synchronizing signal, and the like are input to the signal generator unit 3003. The signal generator unit 3003 converts various signals and generates a clock signal and the like for driving the signal line driver circuit 3006 and the scan line driver circuits 3007.

Signals and power from the external circuit 3004 are input to an internal circuit and the like from an FPC connection portion 3005 in the panel 3010 through an FPC.

The panel 3010 comprises a substrate 3008 mounting the FPC connection portion 3005, the internal circuit, and the light emitting element 3011. The internal circuit comprises the signal line driver circuit 3006, the scan line driver circuit 3007, and a pixel portion 3009. Any one of pixel configurations described in embodiment modes of the invention may be employed for the pixel portion 3009, though a pixel described in Embodiment Mode 1 is employed in FIG. 3.

The pixel portion 3009 is disposed in the center of the substrate 3008, and the signal line driver circuit 3006 and the scan line driver circuit 3007 are disposed at the periphery of the pixel portion 3009. The light emitting element 3011 and a counter electrode of the light emitting element 3011 are formed over the whole surface of the pixel portion 3009.

Figure 4:
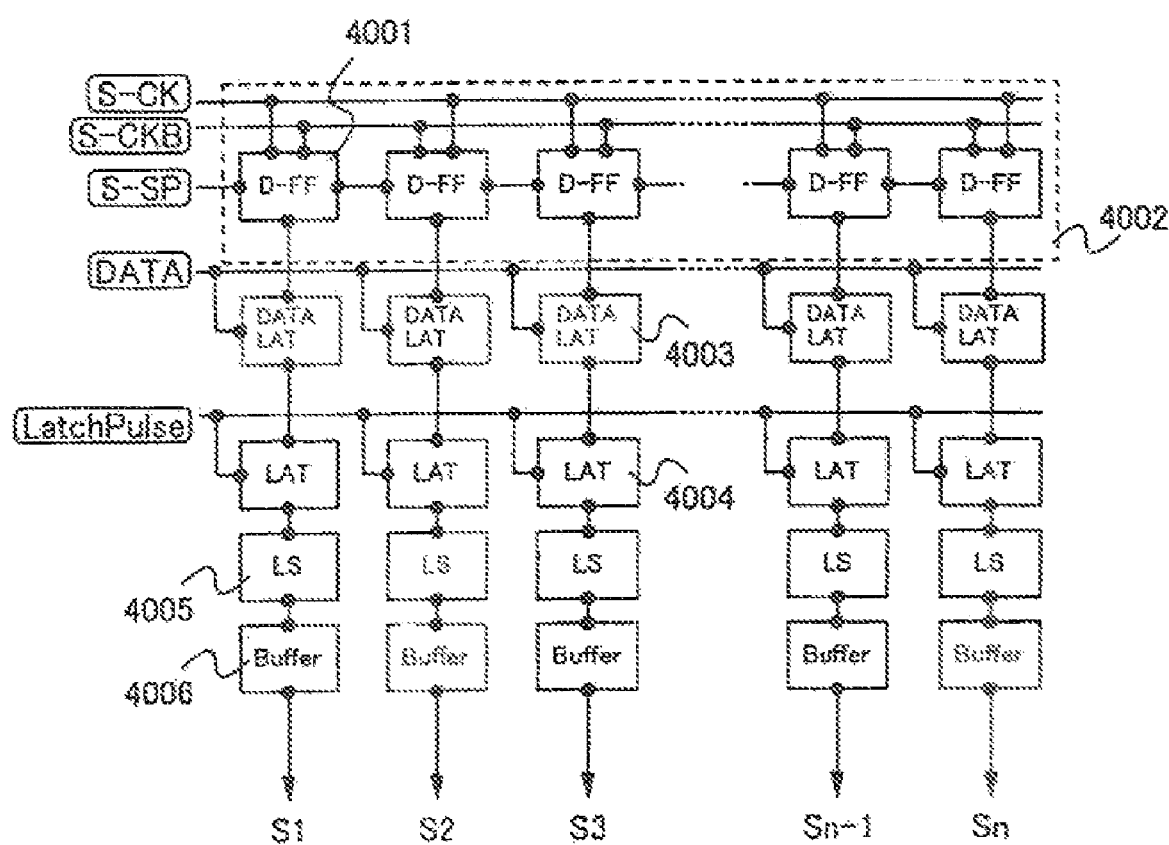
FIG. 4 is a diagram showing a configuration example of a signal line driver circuit.

FIG. 4 is a block diagram showing the signal line driver circuit 3006 in more detail. The signal line driver circuit 3006 comprises a shift register 4002 including a plurality of stages of D-flip flops 4001, a data latch circuit 4003, a latch circuit 4004, a level shifter 4005, a buffer 4006, and the like. It is assumed here that a clock signal (S-CK), an inverted clock signal (S-CKB), a start pulse (S-SP), a video signal (DATA), and a latch pulse (LatchPulse) are input to the signal line driver circuit 3006.

First, a sampling pulse is sequentially output from the shift register 4002 in accordance with the timing of a clock signal, an inverted clock signal, and a start pulse. The sampling pulse is input to the data latch circuit 4003, and in accordance with this timing, a video signal is taken in and thus stored. This operation is sequentially performed from the first column.

When the storage of a video signal is completed in the data latch circuit 4003 on the last stage, a latch pulse is input during a horizontal retrace period, and the video signal stored in the data latch circuit 4003 is transferred to the latch circuit 4004 all at once. Then, it is level-shifted in the level shifter 4005, and adjusted in the buffer 4006 before being output to signal line S1 to Sn all at once. At this time, an H-level (High-level) or an L-level (Low-level) signal is input to pixels in the row selected by the scan line driver circuits 3007, thereby controlling light emission or non-emission of the light emitting element 3011.

Although the active matrix display device shown in this embodiment mode comprises the panel 3010 and the external circuit 3004 each formed independently, they may be integrally formed on the same substrate. Although a light emitting element is employed in the display device in this embodiment mode, a display elements other than the one of this embodiment mode may be employed as well. In addition, the level shifter 4005 and the buffer 4006 is not necessarily provided in the signal line driver circuit 3006.

Embodiment Mode 4

Described in this embodiment mode is one mode of the light emitting device of the invention with reference to drawings.

Figure 8:
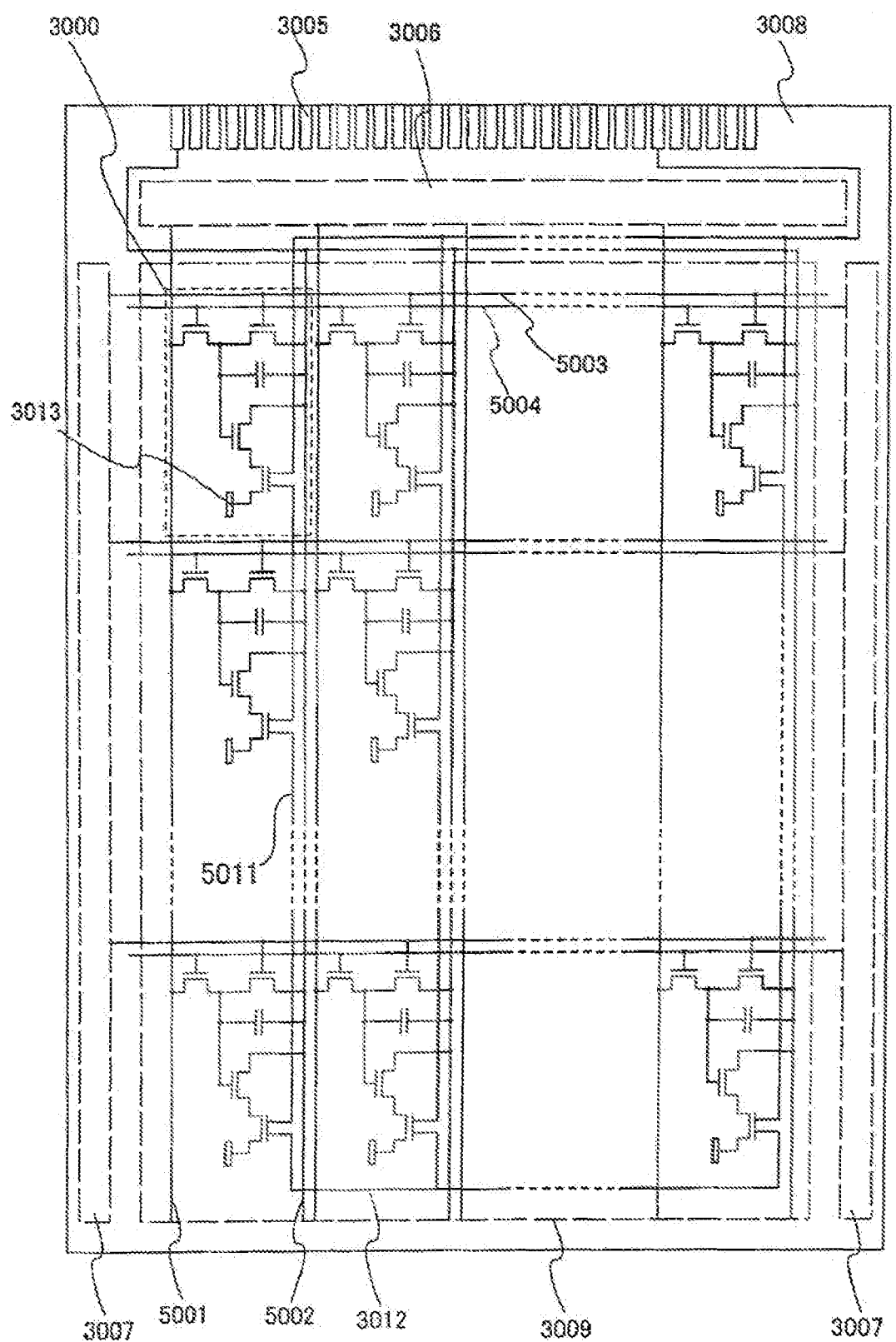
FIG. 8 is a diagram showing a configuration of a pixel portion which is an embodiment mode of the invention.

FIG. 8 shows a configuration of an element substrate of the invention, in which the pixel portion 3009, the scan line driver circuit 3007, the signal line driver circuit 3006, and the FPC connection portion (external input terminal) 3005 are disposed on the substrate 3008. As described in Embodiment Modes 1 and 2, in the pixel portion 3009, a plurality of pixels 3000 each including a transistor typified by a TFT and a pixel electrode 3013 connected to the transistor is provided and disposed in matrix.

A light emitting element is formed in accordance with the arrangement of the pixel electrode 3013 to complete the light emitting element.

In the pixel portion 3009, a first scan line 5004 and a second scan line 5003 are disposed in parallel while a signal line 5001 for sending a video signal and a first power supply line 5002 for supplying electronic power to the light emitting element are disposed in a direction which intersects the first and the second scan lines 5004 and 5003. As for a second power supply line 5011, a driving transistor is connected so as to have two contact points between the gate electrode and the wiring and use the gate electrode as a part of the wiring. Accordingly, the area where the second power supply line 5011 is disposed in parallel with the signal line 5001 and the first power supply line 5002 on the same layer is reduced.

Generally, the number of contact points between the gate electrode and the wiring on another layer is increased according to increase in the number of pixels, leading to increase in the occurrence of contact defects between the gate electrode and the wiring on another layer and increase in the occurrence of linear defects. However, in this embodiment mode, a wiring 3012 is provided for a power supply to the second power supply line 5011, and by which the second power supply line 5011 is connected with each other on the opposite side of being supplied a power from the external of the pixel portion 3009 to the second power supply line 5011 in the pixel portion 3009, resulting in reduced defects. By supplying power from both sides as described above, no linear defect is occurred in the case of having a contact defect only at one point per column and therefore, the occurrence of linear defects can be greatly reduced.

Figure 5:
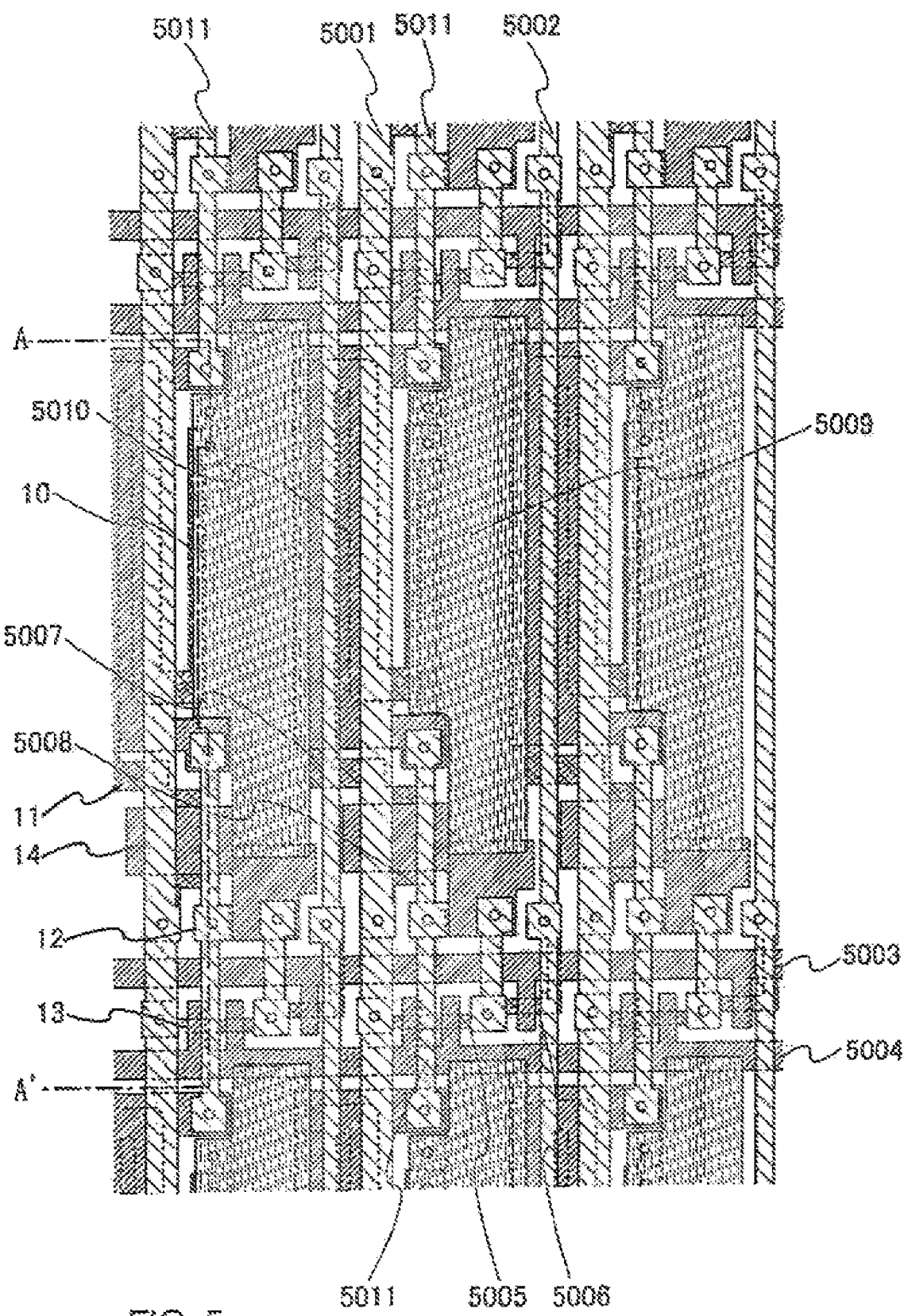
FIG. 5 is a diagram showing in detail a pixel configuration which is an embodiment mode of the invention.

FIG. 5 is a diagram showing a pixel configuration in detail, in which provided are the video signal line 5001, the first power supply line 5002, the second power supply line 5011, and a TFT disposed in an area where surrounded by the first scan line 5004 and the second scan line 5003.

In this embodiment mode, the video signal line 5001, the first power supply line 5002, and the second power supply line 5011 are formed on the same conductive film while the first scan line 5004 and the second scan line 5003 are formed on the same conductive film. Reference numeral 5005 denotes a switching transistor and a part of the first scan line 5004 serves as a gate electrode thereof. According to this configuration, the area where wirings are disposed in parallel on the same layer can be reduced.

Reference numeral 5006 denotes an erasing transistor and a part of the second scan line 5003 serves as a gate electrode thereof. Reference numeral 5007 corresponds to a driving transistor and 5008 corresponds to a current controlling transistor. The driving transistor 5007 has a curved active layer so that the channel length L/the channel width W thereof is larger than that of the current controlling transistor 5008. Reference numeral 5009 corresponds to a pixel electrode which emits light in an area (a light emitting area) overlapped with an electroluminescent layer or the cathode (both are not shown).

Figure 11:
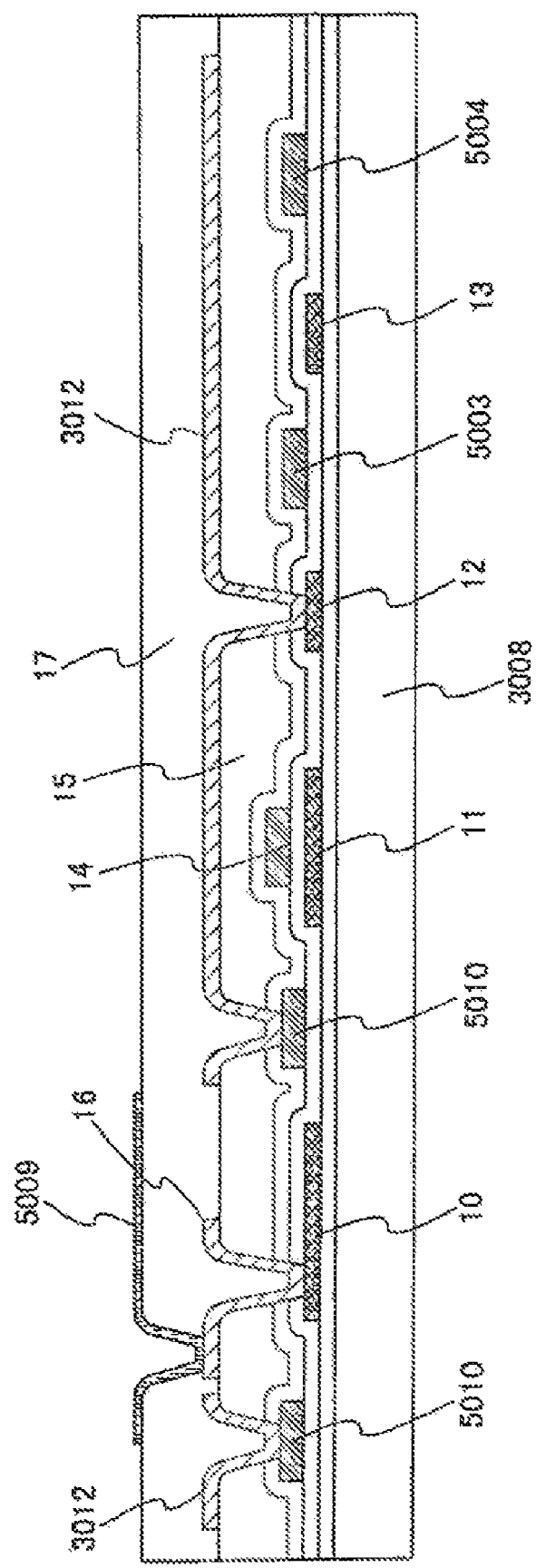
FIG. 11 is a cross sectional view showing the pixel configuration which corresponds to FIG. 5.

FIG. 11 is a vertical cross sectional view taken by cutting along a line A-A' of FIG. 5, where semiconductor layers 10 to 13 are formed on the substrate 3008. Each semiconductor layer is preferably sandwiched between inorganic insulating films having high gas barrier property such as a silicon nitride film and a silicon oxynitride film. Top gate transistors are employed in this embodiment mode, however bottom gate transistors may be employed as well. A gate electrode 5010 of the driving transistor is connected to the wiring 3012 with a first interlayer insulating 5010 of the driving transistor is connected to the wiring 3012 with a first interlayer insulating film 15 interposed therebetween. The pixel electrode 5009 is connected to a wiring 16 with a second interlayer insulating film 17 interposed therebetween.

As described in this embodiment mode, the driving transistor is connected so as to have two contact points between the gate electrode and the wiring and use the gate electrode as a part of the wiring, thereby the area where the second power supply line is disposed in parallel with the signal line and the first power supply line on the same layer is reduced. It brings the decrease in occurrence of faults due to a short circuit between wirings in adjacent pixels. For example, occurrence of a short circuit between wirings caused by dust in before and after steps of a layer on which the signal line or the power supply line is formed.

The top plan view of the invention is just an embodiment example and the invention is not exclusively limited to this.

Embodiment Mode 5

Figure 9A:
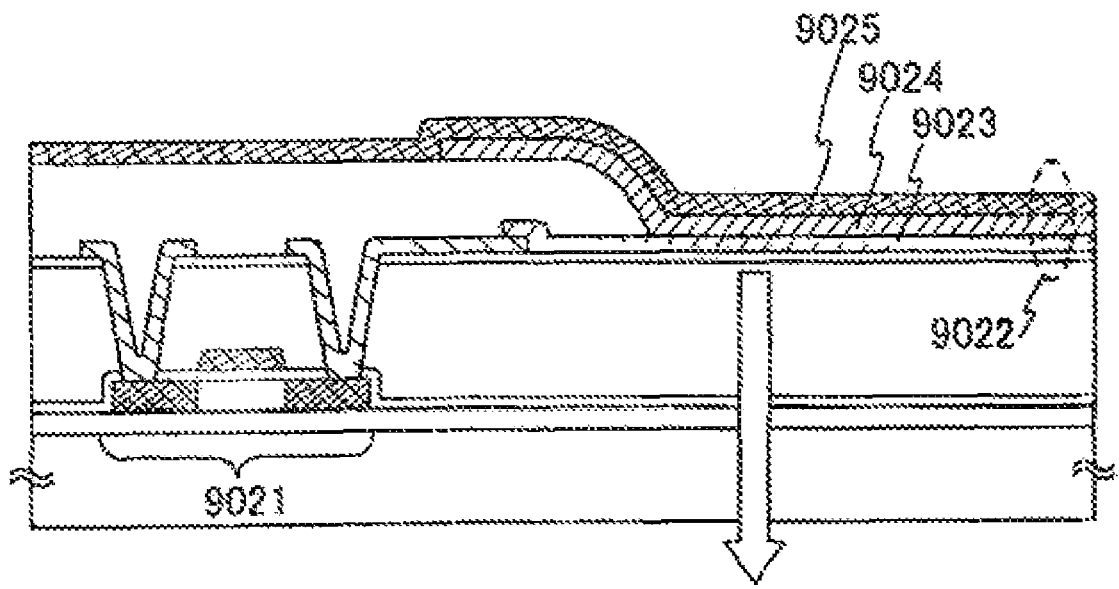
FIGS. 9A and 9B are cross sectional views showing examples of a pixel of the invention.

Described in this embodiment mode is a cross sectional structure of a pixel. FIG. 9A is a cross sectional view of a pixel in which a driving transistor 9021 is a P-type transistor and light emitted from a light emitting element 9022 is transmitted to an anode 9023 side.

In FIG. 9A, the anode 9023 of the light emitting element 9022 is electrically connected to a driving transistor 9021, and an electroluminescent layer 9024 and a cathode 9025 are laminated over the anode 9023 in this order. For the cathode 9025, a known material can be used as long as it is a light reflective conductive film having a low work function. For example, Ca, Al, CaF, MgAg, AlLi, and the like are desirably used. The electroluminescent layer 9024 may be structured by single or multiple layers. When it is structured by multiple layers, a hole injection layer, a hold transporting layer, a light emitting layer, an electron transporting layer, and an electron injection layer are laminated in this order over the anode 9023. It is to be noted that not all of these layers are necessarily provided. The anode 9023 may be formed of a transparent conductive film which transmits light, such as ITO and a conductive film of indium oxide mixed with 2 to 20% of zinc oxide (ZnO).

The overlapping area of the anode 9023, the electroluminescent layer 9024, and the cathode 9025 corresponds to the light emitting element 9022. In the case of the pixel shown in FIG. 9A, light emitted from the light emitting element 9022 is transmitted to the anode 9023 side as shown by a blank arrow.

Figure 9B:
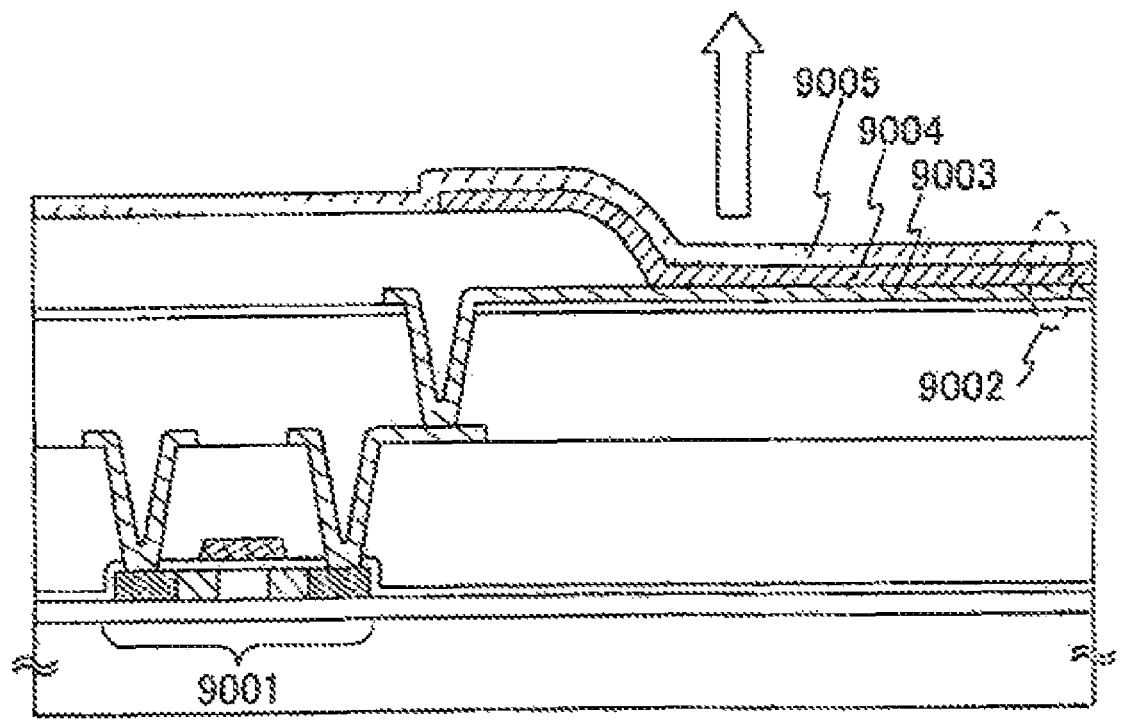

FIG. 9B is a cross sectional view of a pixel in which a driving transistor 9001 is an N-type transistor and light emitted from a light emitting element 9002 is transmitted to an anode 9005 side. In FIG. 9B, a cathode 9003 of the light emitting element 9002 is electrically connected to the driving transistor 9001, and an electroluminescent layer 9004 and the anode 9005 are laminated over the cathode 9003 in this order. For the cathode 9003, a known material can be used as long as it is a light reflective conductive film having a low work function. For example, Ca, Al, CaF, MgAg, AlLi, and the like are desirably used. The electroluminescent layer 9004 may be structured by single or multiple layers. When it is structured by multiple layers, an electron injection layer, an electron transporting layer, a light emitting layer, a hole transporting layer, and a hole injection layer are laminated in this order over the cathode 9003. It is to be noted that not all of these layers are necessarily provided. The anode 9005 may be formed of a transparent conductive film which transmits light, such as ITO and a transparent conductive film of indium oxide mixed with 2 to 20% of zinc oxide (ZnO).

The overlapping area of the cathode 9003, the electroluminescent layer 9004, and the anode 9005 corresponds to the light emitting element 9002. In the case of the pixel shown in FIG. 9B, light emitted from the light emitting element 9002 is transmitted to the anode 9005 side as shown by a blank arrow.

It is to be noted that although the driving transistor is electrically connected to the light emitting element in this embodiment, a current controlling transistor may be interposed between the driving transistor and the light emitting element.

Embodiment Mode 6

Figure 10A:
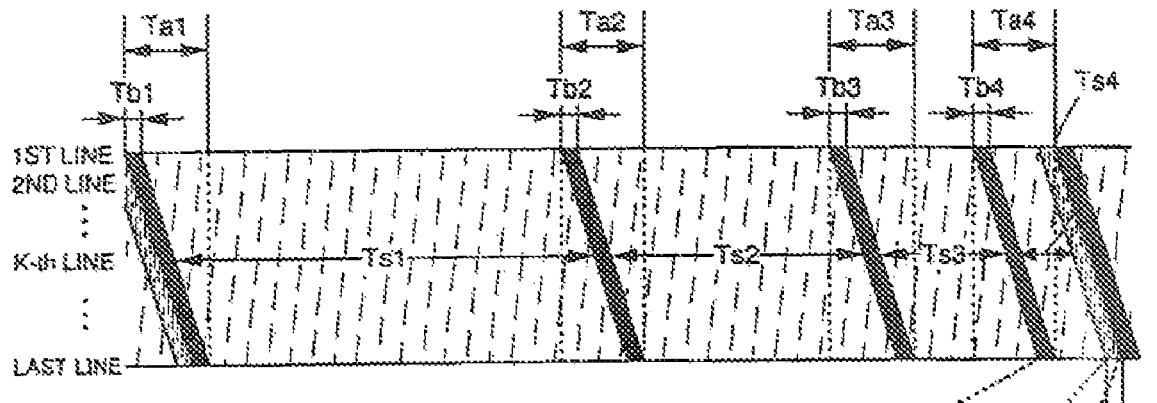
FIGS. 10A and 10B are diagrams showing an example of operating timing of a light emitting device of the invention.
Figure 10B:
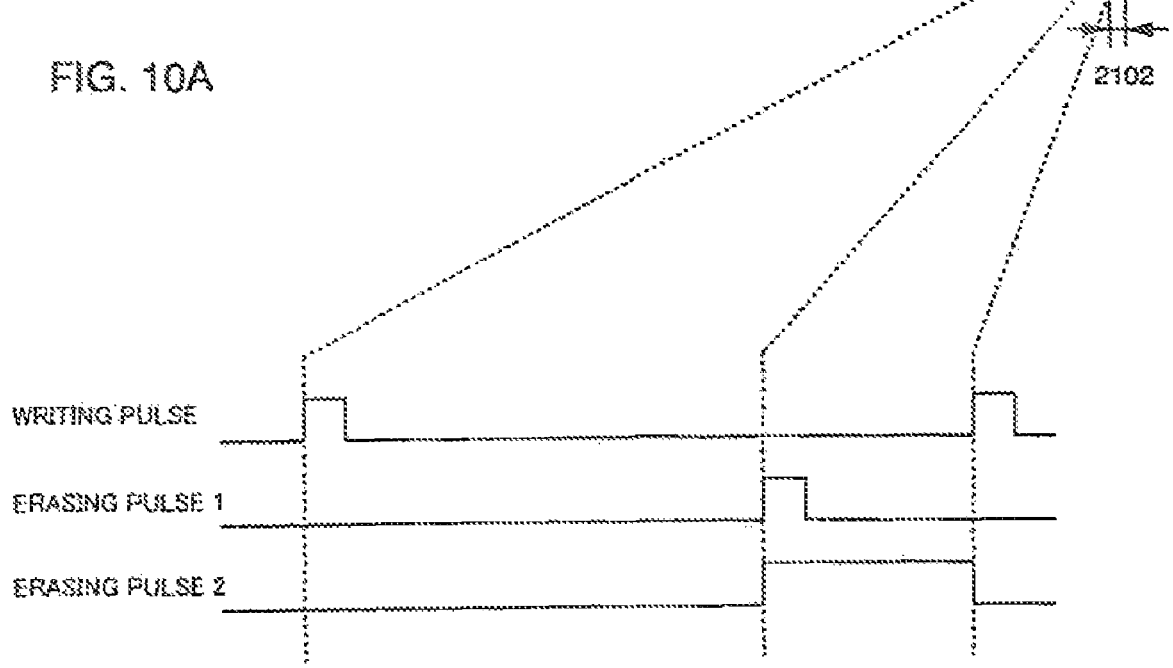

Described with reference to FIGS. 10A and 10B is an example of the drive timing using the pixel configuration of the invention.

FIG. 10A shows and example using digital time gray scale method for displaying images with 4-bit gray scale. The ratio of the time length of data retention periods Ts1 to Ts4 is set as Ts1:Ts2:Ts3:Ts4:=$2^3$:$2^2$:$2^1$:$2^0$=8:4:2:1.

The operation is described next. First, in a writing period Tb1, a first scan line is selected from the first row sequentially, thereby turning ON a switching transistor. Next, a video signal is input to each pixel from a signal line, and light emission or non-light emission of each pixel is controlled according to a potential of the video signal. Once writing of a video signal is completed in a row, that row proceeds to the data retention period Ts1 immediately. The same operation is performed up to the last row, and then a period Ta1 is completed. Subsequently, a writing period Tb2 starts sequentially from the row in which the data retention period Ts1 has been completed.

In a sub-frame period having shorter data retention period than the writing period (corresponding to a fourth sub-frame period here), an erasing period 2102 is provided so that a next writing period does not start immediately after the data retention period. In the erasing period, a light emitting element is made to be in a non-emission state.

Taken as an example here is the case of displaying images with 4-bit gray scale, however the number of bits and gray scales is not limited to this. In addition, light emission is not necessarily performed from Ts1 to Ts4 in sequence. It may be performed at random, or divided into a plurality of periods.

FIG. 10B shows an example of a writing pulse and an erasing pulse. The erasing pulse may be input per row and stored by means of a capacitor and the like in the erasing period as shown in an erasing pulse 1, or H-level may be kept inputting in the erasing period as shown in an erasing pulse 2. The pulses shown in FIG. 10B are examples in the case where an N-type transistor is employed as a switching transistor and an erasing transistor. In the case where a P-type transistor is employed as the switching transistor and the erasing transistor, H-level/L-level of the pulses shown in FIG. 10B are inverted.

Embodiment Mode 7

The light emitting device of the invention can be used in display portions of various electronic apparatuses. In particular, the light emitting device of the invention is desirably applied to a mobile apparatus that requires low power consumption.

FIGS. 12A and 12B show a light emitting device according to the invention after being assembled a connecting wiring that is connected to an external circuit. FIG. 12A is a top plan view, where a pixel portion 1202, a signal line driver circuit 1201, and a scan line driver circuit 1203 are formed on a second substrate 1204. These circuits are formed using Embodiment modes 1 to 6. The second substrate 1204 is attached to face a first substrate 1210 with a sealing material 1205. As these substrates, a glass substrate (known as nonalkali substrate containing alumino silicate glass or barium borosilicate glass) is typically employed while other plastic substrates may be employed. In the case of employing a plastic substrate, a hard coat is preferably deposited on a surface of the plastic substrate or a gas barrier layer is preferably formed thereon for preventing steam from being absorbed.

FIG. 12B is a schematical vertical cross sectional view taken by cutting along a line A-A' of FIG. 12A, where the pixel portion 1202 and the signal line driver circuit 1201 are formed on the first substrate 1210. The signal line driver circuit 1201 is configured by an N-type transistor 1223 and a P-type transistor 1224 in this embodiment mode, however it may be configured by either an N-type transistor or a P-type transistor only. In addition, although all circuit components and the pixel portion 1202 may be integrally formed, only a signal selection circuit such as a shift register may be integrally formed and others may be mounted using an external IC chip.

The pixel portion 1202 comprises a switching transistor 1211 and a driving transistor 1212, and the other transistors are omitted in FIGS. 12A and 12B. However, the transistors shown in Embodiment Modes 1 to 6 are disposed in the pixel portion 1202.

A light emitting element 1218 that is connected to the driving transistor 1212 is structured by a first electrode 1213, a second electrode 1216, and a luminescent layer 1215 containing an organic compound and interposed therebetween. The light emitting element 1218 is formed over a transistor with an interlayer insulating film interposed therebetween. When a light transmissive electrode is employed for either the first electrode 1213 or the second electrode 1216 of the light emitting element 1218, the light emitting device can emit light to the first substrate 1210 side or the second substrate 1204 side. Furthermore, when a light transmissive electrode is employed for both the electrodes, the light emitting device can emit light of the light emitting element to both sides, namely a dual emission display device can be realized.

A passivation layer 1208 is formed on the light emitting element 1218, and the second substrate 1204 is fixed thereto with a resin 1230 for sealing. For more firm sealing, a sealing pattern may be formed by the sealing material 1205 in the periphery of the substrate. In the connect part to the external circuit, a connecting wiring 1228 is lead from the driving circuit side and attached to a flexible printed circuit (FPC 1209) by using an anisotropic conductive material at the end of the first substrate 1210. A module is provided in this manner.

Electronic apparatuses in which such module is mounted include a portable information terminal (a mobile phone, a mobile computer, a portable game machine, and electronic book, and the like), a video camera, a digital camera, a goggle type display, a display, a navigation system, and the like. Specific examples of these electronic apparatuses are shown in FIGS. 6A to 6D.

Figure 6A:
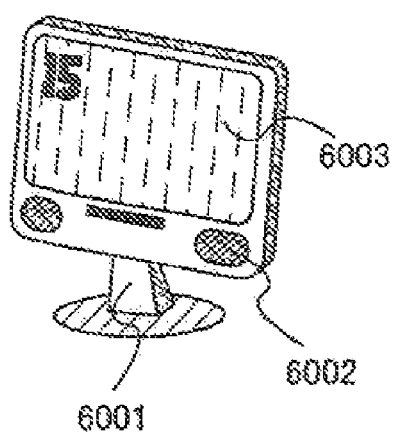
FIGS. 6A to 6D are views showing examples of electronic apparatuses to which the invention is applicable.

FIG. 6A shows a monitor device which includes a housing 6001, and audio output portion 6002, a display portion 6003, and the like. The module of the invention can be mounted as the display portion 6003 to complete this monitor device. The monitor device includes all the information display devices for personal computers, television broadcast reception, advertisement displays, and the like.

Figure 6B:
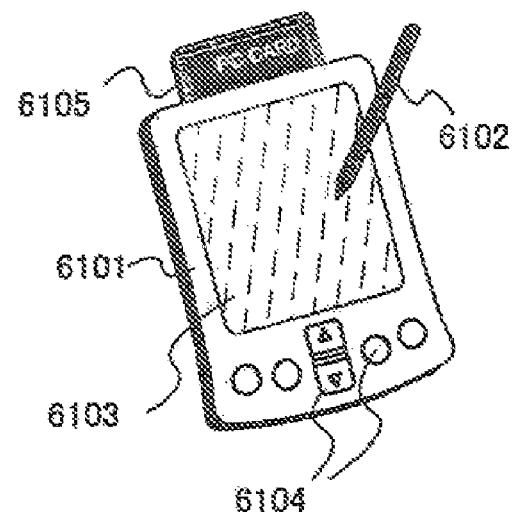

FIG. 6B shows a mobile computer which includes a main body 6101, a stylus 6102, a display portion 6103, operation buttons 6104, an external interface 6105, and the like. The module of the invention can be mounted as the display portion 6103 to complete this mobile computer.

Figure 6C:
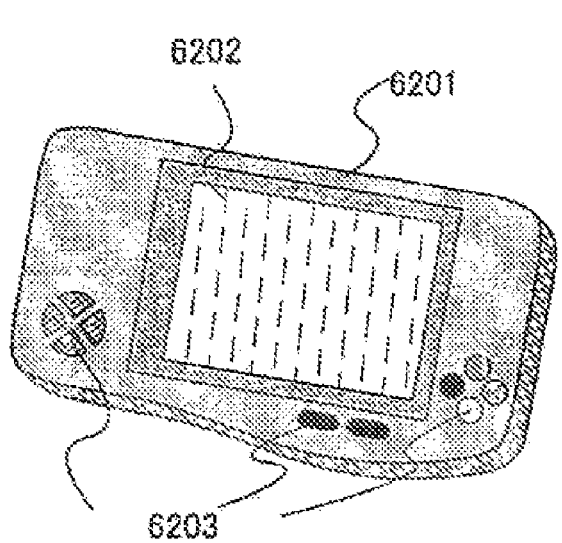

FIG. 6C shows a game machine which includes a main body 6201, a display portion 6202, operation buttons 6203, and the like. The module of the invention can be mounted as the display portion 6202 to complete this game machine.

Figure 6D:
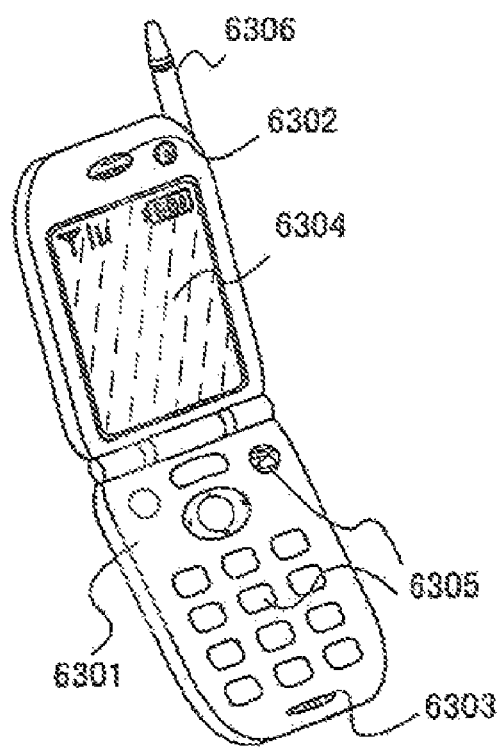
Figure 7:
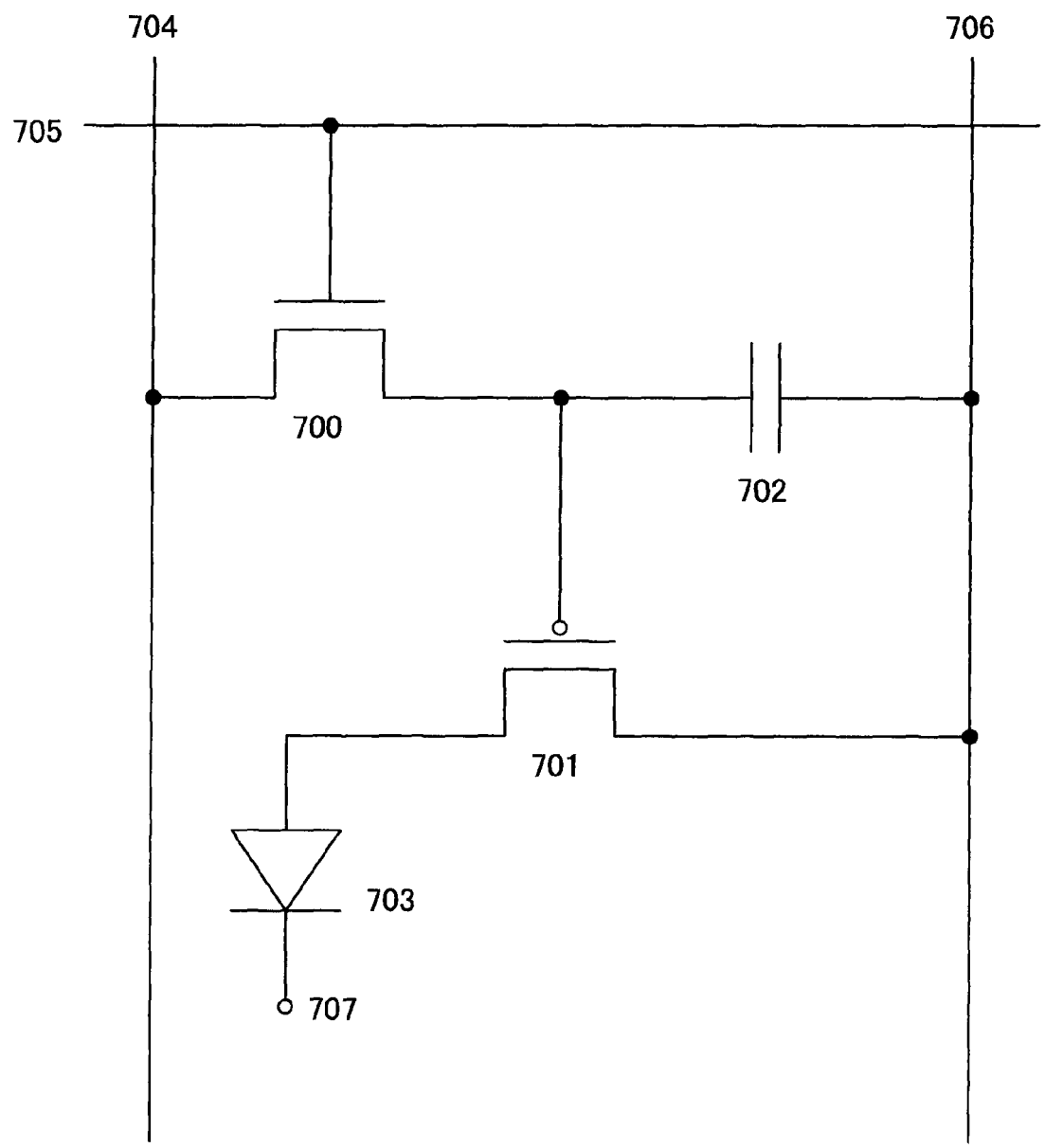
FIG. 7 is a diagram showing a conventional art.

FIG. 6D shows a mobile phone which includes a main body 6301, an audio output portion 6302, an audio input portion 6303, a display portion 6304, operation switches 6305, an antenna 6306, and the like. The module of the invention can be mounted as the display portion 6304 to complete this mobile phone.

As described above, application range of the display device of the invention is so wide that it can be applied to electronic apparatuses in various fields.

A current flowing in a light emitting element can be prevented from being varied without increasing the capacitance of a capacitor provided between a gate and a source of a current controlling transistor or without lowering off-current of a switching transistor. Further, a parasitic capacitance on a gate of the current controlling transistor does not influence the current flowing in the light emitting element. Consequently, causes of variations are decreased, and image quality is thus enhanced significantly. As there is not need to lower off-current of the switching transistor, transistor manufacturing steps can be simplified, leading to cost reduction and improvement in yield.

According to the invention, a plurality of contact points are formed on a gate electrode to use the gate as a part of a wiring, and the gate electrode is connected by using another wiring layer so that the area where wiring are disposed in parallel on the same layer can be reduced. The transistor with this wiring structure brings the decrease in occurrence of wiring defects due to dust and the like in manufacturing steps.

What is claimed is:

1. A display device comprising:
a signal line;
a power source;
a power supply line;
a first wiring;
a second wiring;
a third wiring;
a first pixel comprising a first transistor, a second transistor, and a first light emitting element; and
a second pixel comprising a third transistor, a fourth transistor, and a second light emitting element,
wherein a first region of a gate of the first transistor is electrically connected to the power source through the first wiring,
wherein a second region of the gate of the first transistor is electrically connected to a first region of a gate electrode of the third transistor through the second wiring,
wherein a second region of the gate of the third transistor is electrically connected to the third wiring,
wherein one of a source and a drain of the first transistor is electrically connected to the first light emitting element and the other of the source and the drain of the first transistor is electrically connected to one of a source and a drain of the second transistor,
wherein one of a source and a drain of the third transistor is electrically connected to the second light emitting element and the other of the source and the drain of the third transistor is electrically connected to one of a source and a drain of the fourth transistor,
wherein the other of the source and the drain of the second transistor is electrically connected to the power supply line and a gate of the second transistor is electrically connectable to the signal line, and
wherein the other of the source and the drain of the fourth transistor is electrically connected to the power supply line and a gate of the fourth transistor is electrically connectable to the signal line.

2. The display device according to claim 1, wherein each of the first transistor and the third transistor is fixed in an ON-state.

3. The display device according to claim 1, wherein a channel length of the first transistor is longer than a channel width of the first transistor and a channel length of the second transistor is equal to or shorter than a channel width of the second transistor.

4. The display device according to claim 1, wherein a ratio of the channel length to the channel width of the first transistor is five or more.

5. The display device according to claim 1, wherein the gate of the first transistor is connected to a part of the first wiring and the second wiring.

6. The display device according to claim 1, wherein the first wiring, the second wiring, and the third wiring are arranged in parallel with the signal line and the power supply line.

7. A display device comprising:
a signal line;
a power source;
a power supply line;
a first wiring;
a second wiring;
a third wiring;
a first pixel comprising a first transistor, a second transistor, a third transistor and a first light emitting element; and
a second pixel comprising a fourth transistor, a fifth transistor, a sixth transistor, and a second light emitting element,
wherein a first region of a gate of the first transistor is electrically connected to the power source through the first wiring,
wherein a second region of the gate of the first transistor is electrically connected to a first region of a gate electrode of the fourth transistor through the second wiring,
wherein a second region of the gate of the fourth transistor is electrically connected to the third wiring,
wherein one of a source and a drain of the first transistor is electrically connected to the first light emitting element and the other of the source and the drain of the first transistor is electrically connected to one of a source and a drain of the second transistor,
wherein one of a source and a drain of the fourth transistor is electrically connected to the second light emitting element and the other of the source and the drain of the fourth transistor is electrically connected to one of a source and a drain of the fifth transistor,
wherein the other of the source and the drain of the second transistor is electrically connected to the power supply line and a gate of the second transistor is electrically connected to one of a source and a drain of the third transistor,
wherein the other of the source and the drain of the fifth transistor is electrically connected to the power supply line and a gate of the fifth transistor is electrically connected to one of a source and a drain of the sixth transistor,
wherein the other of the source and the drain of the third transistor is electrically connected to the signal line, and
wherein the other of the source and the drain of the sixth transistor is electrically connected to the signal line.

8. The display device according to claim 7, wherein each of the first transistor and the third transistor is fixed in an ON-state.

9. The display device according to claim 7, wherein a channel length of the first transistor is longer than a channel width of the first transistor and a channel length of the second transistor is equal to or shorter than a channel width of the second transistor.

10. The display device according to claim 7, wherein a ratio of the channel length to the channel width of the first transistor is five or more.

11. The display device according to claim 7, wherein the gate of the first transistor is connected to a part of the first wiring and the second wiring.

12. The display device according to claim 7, wherein the first wiring, the second wiring, and the third wiring are arranged in parallel with the signal line and the power supply line.

13. A display device comprising:
a signal line;
a first scan line;
a second scan line;
a power source;
a power supply line;
a first wiring;
a second wiring;
a third wiring;
a first pixel comprising a first transistor, a second transistor, a third transistor and a first light emitting element; and
a second pixel comprising a fourth transistor, a fifth transistor, a sixth transistor, and a second light emitting element,
wherein a first region of a gate of the first transistor is electrically connected to the power source through the first wiring, wherein a second region of the gate of the first transistor is electrically connected to a first region of a gate electrode of the fourth transistor through the second wiring, wherein a second region of the gate of the fourth transistor is electrically connected to the third wiring, wherein one of a source and a drain of the first transistor is electrically connected to the first light emitting element and the other of the source and the drain of the first transistor is electrically connected to one of a source and a drain of the second transistor, wherein one of a source and a drain of the fourth transistor is electrically connected to the second light emitting element and the other of the source and the drain of the fourth transistor is electrically connected to one of a source and a drain of the fifth transistor, wherein the other of the source and the drain of the second transistor is electrically connected to the power supply line and a gate of the second transistor is electrically connected to one of a source and a drain of the third transistor, wherein the other of the source and the drain of the fifth transistor is electrically connected to the power supply line and a gate of the fifth transistor is electrically connected to one of a source and a drain of the sixth transistor, wherein the other of the source and the drain of the third transistor is electrically connected to the signal line and a gate of the third transistor is electrically connected to the first scan line, and wherein the other of the source and the drain of the sixth transistor is electrically connected to the signal line and a gate of the sixth transistor is electrically connected to the second scan line.

14. The display device according to claim 13, wherein each of the first transistor and the third transistor is fixed in an ON-state.

15. The display device according to claim 13, wherein a channel length of the first transistor is longer than a channel width of the first transistor and a channel length of the second transistor is equal to or shorter than a channel width of the second transistor.

16. The display device according to claim 13, wherein a ratio of the channel length to the channel width of the first transistor is five or more.

17. The display device according to claim 13, wherein the gate of the first transistor is connected to a part of the first wiring and the second wiring.

18. The display device according to claim 13, wherein the first wiring, the second wiring, and the third wiring are arranged in parallel with the signal line and the power supply line.

* * * * *

UNITED STATES PATENT AND TRADEMARK OFFICE
CERTIFICATE OF CORRECTION

PATENT NO. : 7,742,024 B2
APPLICATION NO. : 11/549946
DATED : June 22, 2010
INVENTOR(S) : Ryota Fukumoto et al.

It is certified that error appears in the above-identified patent and that said Letters Patent is hereby corrected as shown below:

Column 2, line 54, replace "pixel" with --pixels--;

Column 4, line 62, replace "10" with --102--;

Column 5, line 2, replace "represent" with --represents--;

Column 5, lines 28-31, delete "A gate of the driving transistor 102 is connected to a second power supply line Wi (i=1 to x), and the other is connected to a gate of the current controlling transistor 103.";

Column 5, line 41, replace "wiring" with --wirings--;

Column 5, line 59, delete "and";

Column 6, line 39, replace "thereof" with --therefore--;

Column 6, line 40, replace "determine" with --determined--;

Column 8, line 58, replace "witching" with --switching--;

Column 9, line 66, replace "line" with --lines--;

Column 10, line 7, replace "Although" with --Also,--;

Column 10, line 9, replace "a display" with --other light emitting--;

Column 10, line 9, delete "other";

Column 11, lines 25-27, delete "5010 of the driving transistor is connected to the wiring 3012 with a first interlayer insulating";

Signed and Sealed this

Twenty-eighth Day of September, 2010

David J. Kappos
*Director of the United States Patent and Trademark Office*

CERTIFICATE OF CORRECTION (continued)
U.S. Pat. No. 7,742,024 B2

Column 11, line 63, replace "hold" with --hole--;

Column 12, line 46, replace "and" with --an--;

Column 12, lines 63-64, replace "fourth sub frame period" with --period Ta4--;

Column 14, line 17, replace "and" with --an--;

Column 14, line 24, replace "and" with --an--;

Column 14, line 57, replace "not" with --no--;

Column 14, line 64, replace "wiring" with --wirings--.